(12) United States Patent
Lee et al.

(10) Patent No.: US 9,070,428 B2
(45) Date of Patent: Jun. 30, 2015

(54) SEMICONDUCTOR DEVICE

(71) Applicant: SK hynix Inc., Gyeonggi-do (KR)

(72) Inventors: Hye-Young Lee, Gyeonggi-do (KR);
Kie-Bong Ku, Gyeonggi-do (KR);
Choung-Ki Song, Gyeonggi-do (KR);
Sung-Hwa Ok, Gyeonggi-do (KR);
Se-Jin Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/090,945

(22) Filed: Nov. 26, 2013

(65) Prior Publication Data
US 2015/0016201 A1    Jan. 15, 2015

(30) Foreign Application Priority Data

Jul. 11, 2013    (KR) .......................... 10-2013-0081526

(51) Int. Cl.
*G11C 8/18* (2006.01)
*G11C 7/10* (2006.01)

(52) U.S. Cl.
CPC ..................................... *G11C 7/1006* (2013.01)

(58) Field of Classification Search
CPC ................................ G11C 7/1051; G11C 8/18
USPC .......................................... 365/189.17, 233.5
See application file for complete search history.

(56) References Cited

U.S. PATENT DOCUMENTS

| | | | | |
|---|---|---|---|---|
| 4,897,817 A | * | 1/1990 | Katanosaka | ................... 365/201 |
| 5,406,566 A | * | 4/1995 | Obara | ........................... 714/719 |
| 5,654,735 A | * | 8/1997 | Nakajima | ....................... 345/99 |
| 5,692,359 A | * | 12/1997 | Casler et al. | .................... 53/306 |
| 6,011,751 A | * | 1/2000 | Hirabayashi | ................... 365/236 |
| 8,063,875 B2 | * | 11/2011 | Ishii | ............................. 345/103 |
| 2002/0131307 A1 | * | 9/2002 | Murai et al. | .................. 365/200 |
| 2010/0080332 A1 | * | 4/2010 | Koto | ............................. 375/356 |
| 2010/0312925 A1 | * | 12/2010 | Osanai et al. | ................... 710/29 |
| 2012/0086713 A1 | * | 4/2012 | Cho et al. | ...................... 345/419 |

FOREIGN PATENT DOCUMENTS

| | | |
|---|---|---|
| KR | 1020070036492 | 4/2007 |
| KR | 1020090004494 | 1/2009 |
| KR | 1020120078571 | 7/2012 |

* cited by examiner

*Primary Examiner* — Michael Tran
(74) *Attorney, Agent, or Firm* — IP & T Group LLP

(57) ABSTRACT

A semiconductor device includes first and second bank groups coupled to first and second data lines which are electrically isolated from each other. The semiconductor device includes a register unit suitable for providing predetermined data to the second data line in a specific mode, a data transfer and output unit suitable for externally outputting the predetermined data loaded onto the second data line and simultaneously transferring the predetermined data to the first data line in the specific mode, and a data output unit suitable for externally outputting the predetermined data loaded onto the first data line in the specific mode.

14 Claims, 6 Drawing Sheets

SEMICONDUCTOR DEVICE

CROSS-REFERENCE TO RELATED APPLICATION

The present application claims priority of Korean Patent Application No. 10-2013-0081526, filed on Jul. 11, 2013, which is incorporated herein by reference in its entirety.

BACKGROUND

1. Field

Exemplary embodiments of the present invention relate to semiconductor design technology, and more particularly, to a semiconductor device in which data lines are separated by bank group and a method of driving the same.

2. Description of the Related Art

In general, a semiconductor device, such as Dynamic Random Access Memory (DRAM), performs a series of operations of storing or providing data when an operation of inputting and outputting data is requested by a controller, e.g., a central processing unit (CPU).

Furthermore, as the operating speed of a semiconductor system including a semiconductor device becomes fast and technology related to a semiconductor integrated circuit is advanced, a semiconductor device has been requested to input and output data at a faster rate. For this reason, additional circuits for improving performance when performing a data input/output (I/O) operation are gradually added to a semiconductor device.

In particular, there is a need for a multi-purpose register (MPR) in order to improve the performance of a semiconductor device when performing a data I/O operation. For example, in a Double Data Rate 3 Synchronous Dynamic Random Access Memory (DDR3 SDRAM), a multi-purpose register (MPR) has been used to support a read leveling operation. The read leveling operation is an operation of sending a data pattern, previously defined in a register of a memory chip, to a set of pins and controlling a skew of a data strobe signal DQS between a controller and the memory chip. Here, an operation for reading the data pattern stored in the register is performed irrespective of normal data stored in a memory cell. Accordingly, a kind of memory access operation, such as enabling a word line or precharging a bit line in order to read data patterns, is not necessary.

As described above, a multi-purpose register (MPR) in DDR3 SDRAM has been used to simply store predetermined data patterns. This is called a 'Fixed Value Read-Out' characteristic. In this characteristic, an additional operation for writing data, for example, MPR Write operation may not be necessary. For example, in a read leveling operation mode, i.e., MPR operation mode, predetermined pattern data, such as '10101010', is uniformly outputted in response to a read command although a controller does not apply an active command to a memory chip, and thus a tuning task (tDS/tDH) for a high-speed operation between the controller and a memory chip may be performed.

In the next generation memory product group including DDR4 SDRAM, however, a method of writing a value of pattern data stored in and outputted from a multi-purpose register (MPR) in advance not a method of previously setting a value of the pattern data has been proposed. That is, the multi-purpose register (MPR) has a 'Non-fixed Value Read-out' characteristic not the existing 'Fixed Value Read-out' characteristic.

FIG. 1 shows a block diagram of a known semiconductor device.

Referring to FIG. 1, the semiconductor device 100 includes first to fourth global lines GIO_BG0<0:63> to GIO_BG3<0:63>, first to fourth bank groups BG0 to BG3 coupled with the first to fourth global lines GIO_BG0<0:63> to GIO_BG3<0:63>, respectively, an upper multi-purpose register MPR0, a lower multi-purpose register MPR1, an upper data output unit UDQ, and a lower data output unit LDQ. Each of the first to fourth global lines GIO_BG0<0:63> to GIO_BG3<0:63> includes a plurality of global lines and is electrically isolated from each other. The first to fourth bank groups BG0 to BG3 supply normal data to the plurality of first to fourth global lines GIO_BG0<0:63> to GIO_BG3<0:63> in a normal mode. The upper multi-purpose register MPR0 serves to supply multi-purpose data to the plurality of first global lines GIO_BG0<0:63> or the plurality of second global lines GIO_BG1<0:63> in an MPR operation mode. The lower multi-purpose register MPR1 serves to supply multi-purpose data to the plurality of third global lines GIO_BG2<0:63> or the plurality of fourth global lines GIO_BG3<0:63> in the MPR operation mode. The upper data output unit UDQ serves to externally output data loaded onto the first global lines GIO_BG0<0:63> or the second global lines GIO_BG1<0:63>. The lower data output unit LDQ serves to externally output data loaded onto the third global lines GIO_BG2<0:63> or the fourth global lines GIO_BG3<0:63>.

Each of the first to the fourth bank groups BG0 to BG3 includes a plurality of banks. The first and the second bank groups BG0 and BG1 are disposed in an upper memory area MA0, and the third and the fourth bank groups BG2 and BG3 are disposed in a lower memory area MA1. The upper memory area MA0 and the lower memory area MA1 are divided on the basis of a bank group on which a data transfer operation is performed depending on a data width option mode. For example, assuming that a maximum data width option mode supported by the semiconductor device 100 is an 'X16 mode', in the 'X16 mode', data outputted from the first bank group BG0 is externally outputted through eight upper pads (not shown) and simultaneously data outputted from the third bank group BG2 is externally outputted through eight lower pads (not shown), or data outputted from the second bank group BG1 is externally outputted through the eight upper pads and simultaneously data outputted from the fourth bank group BG3 is externally outputted through the eight lower pads. As described above, a memory area is divided into upper and lower memory areas depending on a data output method. Hereinafter, the first and the second bank groups BG0 and BG1 are referred to as first and second upper bank groups BG0 and BG1, and the third and the fourth bank groups BG2 and BG3 are referred to as first and second lower bank groups BG2 and BG3.

Furthermore, although not shown, the first to fourth global lines GIO_BG0<0:63> to GIO_BG3<0:63> are coupled with the plurality of banks included in the first to the fourth bank groups BG0 to BG3. For example, the first global lines GIO_BG0<0:63> are coupled with the plurality of banks, included in the first bank group BG0, in common. The second global lines GIO_BG1<0:63> are coupled with the plurality of banks, included in the second bank group BG1, in common. The third global lines GIO_BG2<0:63> are coupled with the plurality of banks, included in the third bank group BG2, in common. The fourth global lines GIO_BG3<0:63> are coupled with the plurality of banks, included in the fourth bank group BG3, in common. Meanwhile, the first and second global lines GIO_BG0<0:63> and GIO_BG1<0:63> are coupled with the upper multi-purpose register MPR0, the upper data output unit UDQ, and the lower data output unit LDQ in common, and the third and fourth global lines GIO_BG2<0:63> and GIO_BG3<0:63> are coupled with the lower data output unit LDQ and the lower multi-purpose register MPR1 in common. In this case, as described above, in a maximum data width option mode (e.g., X16 mode), data may be externally outputted through the upper data output unit UDQ and the lower data output unit LDQ, and in a data width option mode (e.g., X8 mode) other than the maximum data width option mode (e.g., X16 mode), data may be externally outputted through the lower data output unit LDQ only.

Furthermore, the upper multi-purpose register MPR0 is disposed in an upper peripheral area PAD that is closer to the upper memory area MA0 than to the lower memory area MA1. Furthermore, the lower multi-purpose register MPR1 is disposed in a lower peripheral area PA1 that is closer to the lower memory area MA1 than to the upper memory area MA0. For reference, circuits for providing multi-purpose data to be stored in the upper multi-purpose register MPR0 and the lower multi-purpose register MPR1 may be disposed in the lower peripheral area PA1. For example, a mode register set (MRS) circuit and a command & address parity (CAP) circuit may be disposed in the lower peripheral area PA1.

Furthermore, the upper data output unit UDQ externally outputs data loaded onto the first global lines GIO_BG0<0:63> or the second global lines GIO_BG1<0:63> only in a maximum data width option mode (e.g., X16 mode). Furthermore, the lower data output unit LDQ externally outputs data, loaded onto the third global lines GIO_BG2<0:63> or the fourth global lines GIO_BG3<0:63>, only in a maximum data width option mode (e.g., X16 mode), but externally outputs data, loaded onto the first to fourth global lines GIO_BG0<0:63> to GIO_BG3<0:63>, in a mode (e.g., X8 mode) other than the maximum data width option mode. Meanwhile, the upper data output unit UDQ and the lower data output unit LDQ are disposed in the upper peripheral area PA0.

The operation of the semiconductor device 100 configured as described above is described below. It is hereinafter assumed that a maximum data width option mode is an 'X16 mode'.

First, the operation of the semiconductor device 100 in a normal mode is described.

When the X16 mode is entered, the upper data output unit UDQ externally outputs normal data, supplied by one of the first and the second upper bank groups BG0 and BG1, through the eight upper pads (not shown), and the lower data output unit LDQ externally outputs normal data, supplied by one of the first and the second lower bank groups BG2 and BG3, through the eight lower pads (not shown).

When an X8 mode is entered, only the lower data output unit LDQ is enabled, and thus normal data supplied by at least one of the first and the second upper bank groups BG0 and BG1 and the first and the second lower bank groups BG2 and BG3 is externally outputted through the eight pads.

A method of driving the semiconductor device 200 in an MPR operation mode is described below.

When the X16 mode is entered, the upper data output unit UDQ externally outputs multi-purpose data, supplied by the upper multi-purpose register MPR0, through the eight upper pads and the lower data output unit LDQ externally outputs multi-purpose data, supplied by the lower data output unit LDQ, through the eight lower pads.

The semiconductor device 100 having the above construction may have the following concerns.

The upper and lower multi-purpose registers MPR0 and MPR1 for providing multi-purpose data in the MPR operation mode are included in the upper peripheral area PA0 and the lower peripheral area PA1, respectively. In this case, in a maximum data width option mode, the multi-purpose data is loaded onto the first to fourth global lines GIO_BG0<0:63> to GIO_BG3<0:63> separated by bank group. However, there is a concern in that a large area may be occupied because the upper multi-purpose register MPR0 and the lower multi-purpose register MPR1 are included in the upper and lower peripheral areas. Furthermore, there is a concern in that an area occupied by the I/O lines of the upper and lower multi-purpose registers MPR0 and MPR1 may be increased because the I/O lines of the upper and lower multi-purpose registers MPR0 and MPR1 are expected to increase according to the number of the upper and lower multi-purpose registers MPR0 and MPR1.

SUMMARY

An exemplary embodiment of the present invention is directed to a semiconductor device capable of externally outputting multi-purpose data, corresponding to a maximum data width option mode, through one MPR.

In accordance with an exemplary embodiment of the present invention, a semiconductor device including first and second bank groups coupled to first and second data lines which are electrically isolated from each other may include a register unit suitable for providing predetermined data to the second data line in a specific mode, a data transfer and output unit suitable for externally outputting the predetermined data loaded onto the second data line and simultaneously transferring the predetermined data to the first data line in the specific mode, and a data output unit suitable for externally outputting the predetermined data loaded onto the first data line in the specific mode.

In accordance with an exemplary embodiment of the present invention, a semiconductor device including first and second bank groups coupled to first and second data lines which are electrically isolated from each other may a multi-purpose register suitable for providing multi-purpose data to the second data line in response to an MPR mode signal, a route selection unit suitable for generating first and second route selection signals by combining first and second bank group selection signals, the MPR mode signal, and a predetermined data width option mode signal, a route providing and data output unit suitable for externally outputting the mufti-purpose data loaded onto the second data line and simultaneously transferring the multi-purpose data to the first data line in response to the first and the second route selection signals, and a data output unit suitable for externally outputting the multi-purpose data loaded onto the first data line in response to the first route selection signal.

In accordance with an exemplary embodiment of the present invention, a semiconductor device including first and second bank groups coupled to first and second data lines which are electrically isolated from each other may include a multi-purpose register suitable for providing multi-purpose data to the first data line in response to an MPR mode signal, an enable signal generation unit suitable for generating an enable signal in response to an MPR mode signal and a predetermined data width option mode signal, a driver suitable for transferring the multi-purpose data loaded onto the first data line to the second data line in response to the enable signal, a first data output unit suitable for externally outputting the multi-purpose data loaded onto the first data line, and a second data output unit suitable for externally outputting the multi-purpose data loaded onto the second data line.

In accordance with an exemplary embodiment of the present invention, a method of driving a semiconductor device for transmitting normal data by bank group through first and second data lines electrically isolated from each other in a normal mode may include electrically coupling the first and the second data lines to the bank group and providing the first data line with multi-purpose data stored in a multi-purpose register (MPR) in response to a predetermined data width option mode signal and an MPR operation mode signal; and externally outputting the multi-purpose data through a first data output unit coupled to the first data line and simultaneously externally outputting the multi-purpose data through a second data output unit coupled to the second data line.

In the providing of the first data line with the multi-purpose data stored in the multi-purpose register, the first and the second data lines may be coupled by controlling a route along which the normal data is transmitted. The route along which the normal data is transmitted may comprise a data route included in the first data output unit. In the providing of the first data line with the multi-purpose data stored in the multi-purpose register, the first and the second data lines may be coupled through a driver, and the driver may drive the multi-purpose data loaded onto the first data line to the second data line. The predetermined data width option mode may be a maximum data width option mode supported by the semiconductor device.

DETAILED DESCRIPTION

Figure 1:
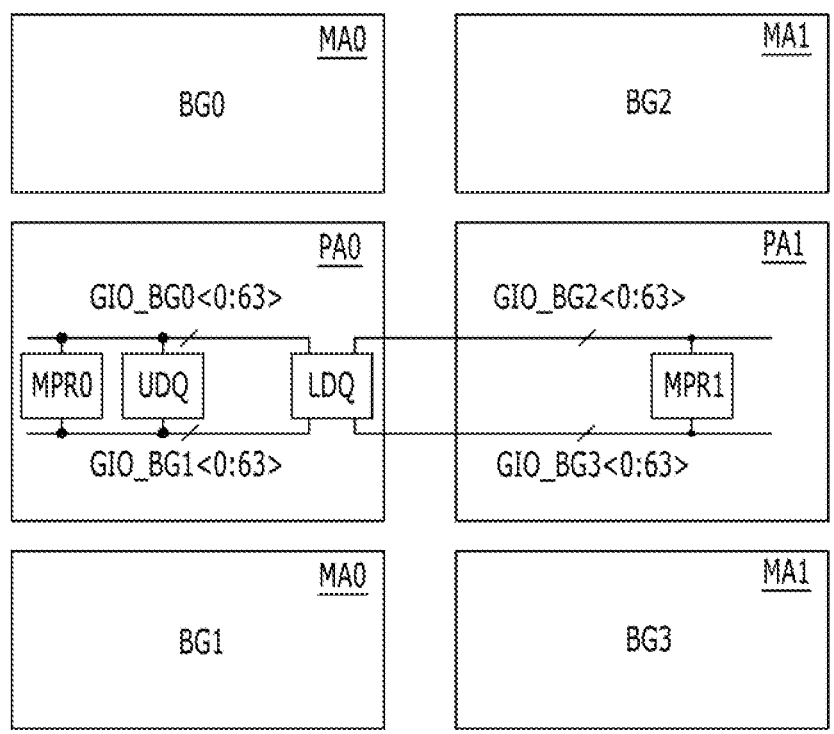
FIG. 1 is a block diagram of a known semiconductor device.

Various exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

In the following exemplary embodiment of the present invention hereinafter, it is assumed that the number of bank groups is 4.

Figure 2:
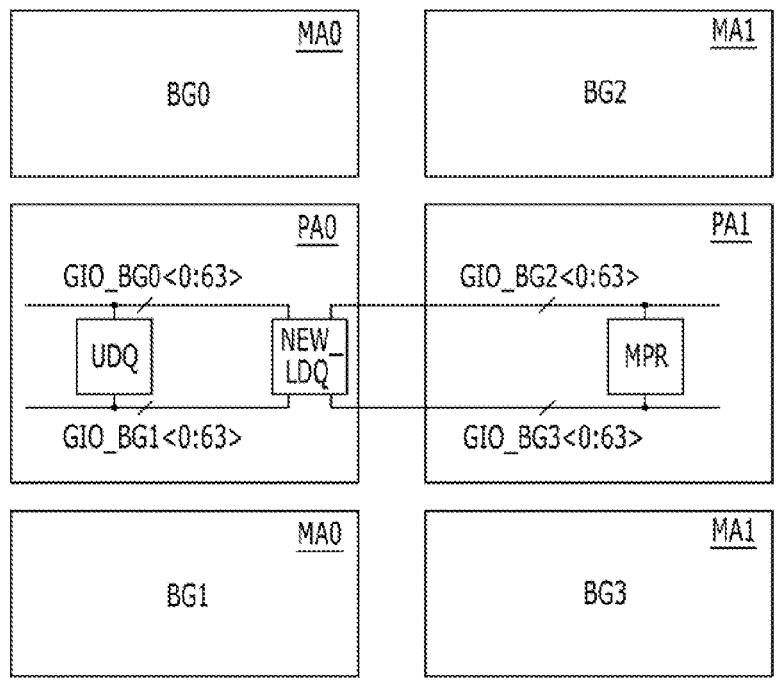
FIG. 2 is a block diagram of a semiconductor device in accordance with an exemplary embodiment of the present invention.

FIG. 2 is a block diagram of a semiconductor device in accordance with a first exemplary embodiment of the present invention.

Referring to FIG. 2, the semiconductor device 200 includes a first to fourth global lines GIO_BG0<0:63> to GIO_BG3<0:63>, first to fourth bank groups BG0 to BG3, a multi-purpose register MPR, a data transfer and output unit NEW_LDQ and an upper data output unit UDQ. Each of the first to fourth global lines GIO_BG0<0:63> to GIO_BG3<0:63> includes a plurality of global lines and is electrically isolated from each other. The first to fourth bank groups BG0 to BG3 coupled to the first to fourth global lines GIO_BG0<0:63> to GIO_BG3<0:63>, respectively, and serve to supply normal data to the first to fourth global lines GIO_BG0<0:63> to GIO_BG3<0:63> in a normal mode. The multi-purpose register MPR serves to supply multi-purpose data to the third global lines GIO_BG2<0:63> or the fourth global lines GIO_BG3<0:63> in an MPR operation mode. The data transfer and output unit NEW_LDQ serves to externally output multi-purpose data loaded onto the third global lines GIO_BG2<0:63> or the fourth global lines GIO_BG3<0:63> and simultaneously transfer the multi-purpose data to the first global lines GIO_BG0<0:63> or the second global lines GIO_BG1<0:63> in the MPR operation mode. The upper data output unit UDQ serves to externally output multi-purpose data loaded onto the first global lines GIO_BG0<0:63> or the second global lines GIO_BG1<0:63> in the MPR operation mode.

Each of the first to the fourth bank groups BG0 to BG3 includes a plurality of banks. The first and the second bank groups BG0 and BG1 are disposed in an upper memory area MA0, and the third and the fourth bank groups BG2 and BG3 are disposed in a lower memory area MA1. Here, the upper memory area MA0 and the lower memory area MA1 are divided on the basis of a bank group on which a data transfer operation is performed depending on a data width option mode. For example, assuming that a maximum data width option mode supported by the semiconductor device 200 is an 'X16 mode', in the 'X16 mode', data outputted from the first bank group BG0 is externally outputted through eight upper pads (not shown) and simultaneously data outputted from the third bank group BG2 is externally outputted through eight lower pads (not shown), or data outputted from the second bank group BG1 is externally outputted through the eight upper pads and simultaneously data outputted from the fourth bank group BG3 is externally outputted through the eight lower pads. As described above, a memory area is divided into upper and lower memory areas depending on a data output method. Hereinafter, the first and the second bank groups BG0 and BG1 are referred to as first and second upper bank groups BG0 and BG1, and the third and the fourth bank groups BG2 and BG3 are referred to as first and second lower bank groups BG2 and BG3.

Furthermore, although not shown, the first to fourth global lines GIO_BG0<0:63> to GIO_BG3<0:63> are coupled to the plurality of banks included in the first to the fourth bank groups BG0 to BG3 in common. For example, the first global lines GIO_BG0<0:63> are coupled to the plurality of banks included in the first bank group BG0 in common. The second global lines GIO_BG1<0:63> are coupled to the plurality of banks included in the second bank group BG1 in common. The third global lines GIO_BG2<0:63> are coupled to the plurality of banks included in the third bank group BG2 in common. The fourth global lines GIO_BG3<0:63> are coupled to the plurality of banks included in the fourth bank group BG3 in common. Meanwhile, the plurality of first and second global lines GIO_BG0<0:63> and GIO_BG1<0:63> are coupled to the data transfer and output unit NEW_LDQ and the upper data output unit UDQ in common, and the third and fourth global lines GIO_BG2<0:63> and GIO_BG3<0:63> are coupled to the data transfer and output unit NEW_LDQ and the multi-purpose register MPR in common. In this case, as described above, in a maximum data width option mode, e.g., X16 mode, data may be externally outputted through the data transfer and output unit NEW_LDQ and the upper data output unit UDQ, and in a data width option mode, e.g. X8 mode, other than the maximum data width option mode, e.g., X16 mode, data may be externally outputted through the data transfer and output unit NEW_LDQ. In particular, in an MPR operation mode, the third and fourth global lines GIO_BG2<0:63> and GIO_BG3<0:63> transfer multi-purpose data, supplied by the multi-purpose register MPR, to the data transfer and output unit NEW_LDQ.

Furthermore, the multi-purpose register MPR provides multi-purpose data to the third and fourth global lines GIO_BG2<0:63> and GIO_BG3<0:63> in the MPR operation mode. The multi-purpose register MPR is disposed in a lower peripheral area PA1 closer to the lower memory area MA1 than to the upper memory area MA0. For reference, circuits for providing multi-purpose data to be stored in the multi-purpose register MPR may be disposed in the lower peripheral area PA1. For example, a mode register set (MRS) circuit and a command & address parity CAP) circuit may be disposed in the lower peripheral area PA1.

Furthermore, the data transfer and output unit NEW_LDQ selectively outputs normal data, loaded onto the first to fourth global lines GIO_BG0<0:63> to GIO_BG3<0:63>, externally in the normal mode and externally outputs multi-purpose data loaded onto the third global lines GIO_BG2<0:63> or the fourth global lines GIO_BG3<0:63> in the MPR operation mode. In particular, in the MPR operation mode, when a maximum data width option mode, e.g., X16 mode, is entered, the data transfer and output unit NEW_LDQ externally outputs multi-purpose data loaded onto the third global lines GIO_BG2<0:63> or the fourth global lines GIO_BG3<0:63> and simultaneously transfers the multi-purpose data to the first global lines GIO_BG0<0:63> or the second global lines GIO_BG1<0:63>.

Furthermore, the upper data output unit UDQ externally outputs normal data, loaded onto the first global lines GIO_BG0<0:63> or the second global lines GIO_BG1<0:63>, in the normal mode and externally outputs multi-purpose-data loaded on the first global lines GIO_BG0<0:63> or the second global lines GIO_BG1<0:63> in the MPR operation mode.

Figure 3:
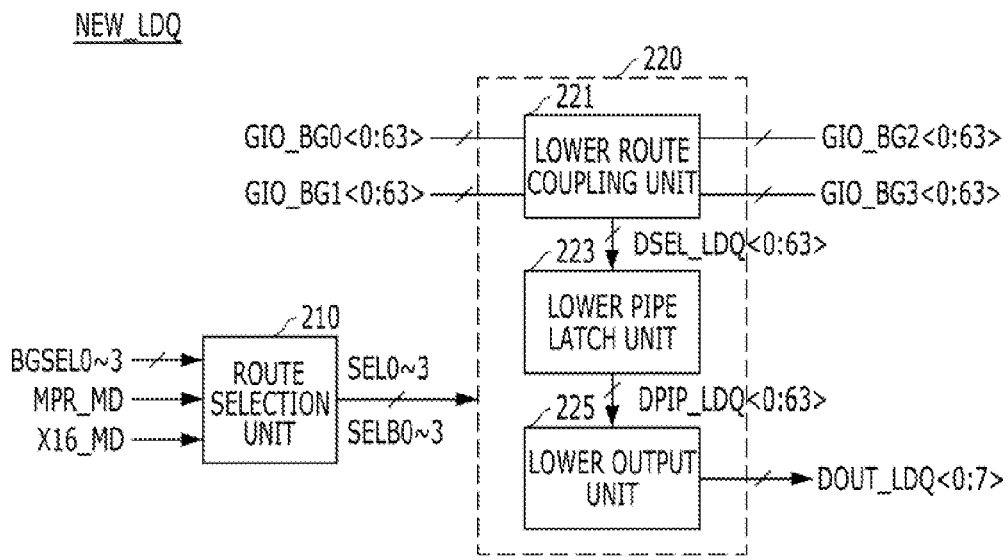
FIG. 3 shows a detailed block diagram illustrating an example of a lower data output unit shown in FIG. 2.
Figure 4:
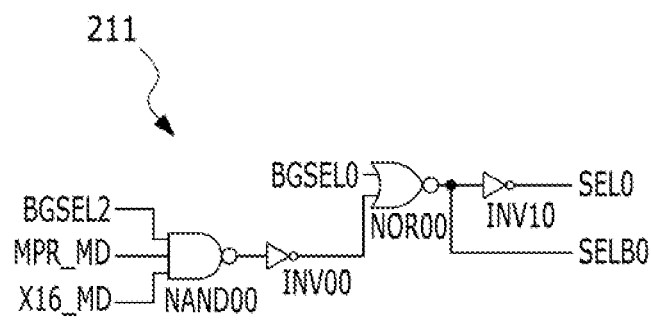
FIG. 4 shows a circuit diagram of a route selection unit shown in FIG. 3.
Figure 4:
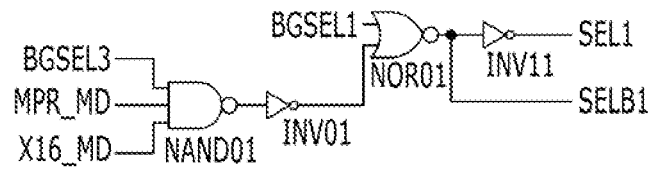
Figure 4:
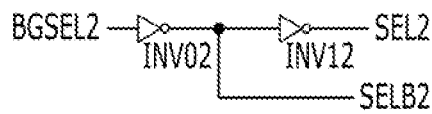
Figure 4:
Figure 5:
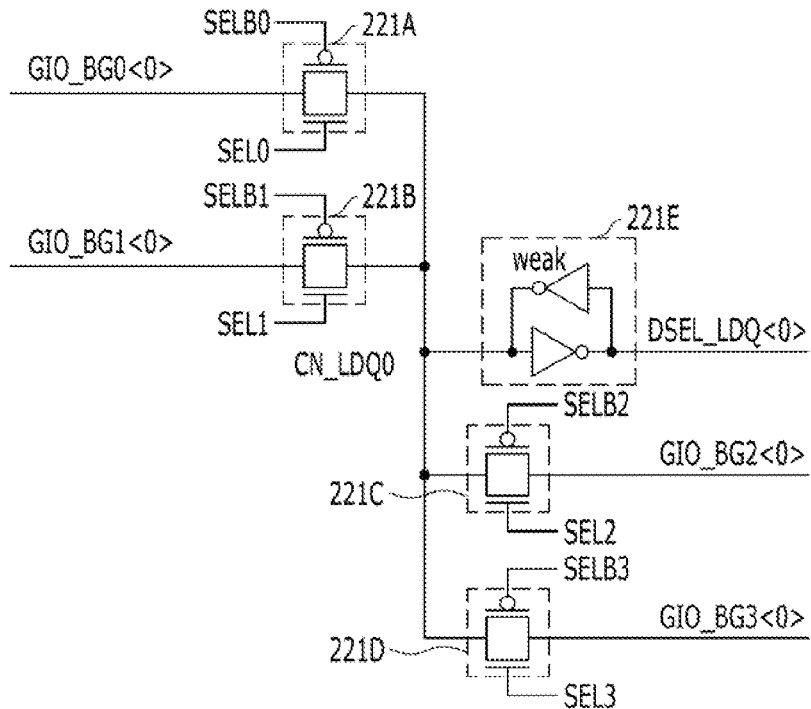
FIG. 5 shows a circuit diagram of a lower route connection unit shown in FIG. 3.

Meanwhile, FIG. 3 shows a detailed block diagram of the data transfer and output unit NEW_LDQ, FIG. 4 is a circuit diagram showing a route selection unit shown in FIG. 3, and FIG. 5 is a circuit diagram showing a lower route connection unit shown in FIG. 3.

Referring to FIG. 3, the data transfer and output unit NEW_LDQ includes a route selection unit 210 and a route providing and data output unit 220. The route selection unit 210 generates first to fourth route selection signals SEL0 to SEL3 and SELB0 to SELB3 by combining first to fourth bank group selection signals BGSEL0 to BGSEL3 for selecting the first and the second upper bank groups BG0 and BG1 and the first and the second lower bank groups BG2 and BG3, respectively, an MPR mode signal MPR_MD that is activated in the MPR operation mode, and a data width option mode signal X16_MD that is activated in a maximum data width option mode, e.g., X16 mode. The route providing and data output unit 220 externally outputs multi-purpose data loaded onto the third global lines GIO_BG2<0:63> or the fourth global lines GIO_BG3<0:63> and simultaneously provides a route along which the multi-purpose data is provided to the first global lines GIO_BG0<0:63> or the second global lines GIO_BG1<0:63> in response to the first to the fourth route selection signals SEL0 to SEL3 and SELB0 to SELB3.

Referring to FIG. 4, the route selection unit 210 includes a first route selection signal generator 211 for generating the first route selection signals SEL0 and SELB0 by combining the first and the third bank group selection signals BGSEL0 and BGSEL2, the MPR mode signal MPR_MD, and the data width option mode signal X16_MD, a second route selection signal generator 213 for generating the second route selection signals SEL1 and SELB1 by combining the second and the fourth bank group selection signals BGSEL1 and BGSEL3, the MPR mode signal MPR_MD, and the data width option mode signal X16_MD, a third route selection signal generator 215 for generating the third route selection signals SEL2 and SELB2 in response to the third bank group selection signal BGSEL2, and a fourth route selection signal generator 217 for generating the fourth route selection signals SEL3 and SELB3 in response to the fourth bank group selection signal BGSEL3.

The first route selection signal generator 211 includes a first NAND gate NAND00 for performing a NAND operation on the third bank group selection signal BGSEL2, the MPR mode signal MPR_MD, and the data width option mode signal X16_MD, a first inverter INV00 for inverting the output signal of the first NAND gate NAND00, a first NOR gate NOR00 for performing a NOR operation on the output signal of the first inverter INV00 and the first bank group selection signal BGSEL0, and a second inverter INV10 for inverting the output signal SELB0 of the first NOR gate NOR00. Here, the output signal SELB0 of the first NOR gate NOR00 and the output signal SEL0 of the second inverter INV10 are used as the first route selection signals SEL0 and SELB0.

The second route selection signal generator 213 includes a second NAND gate NAND01 for performing a NAND operation on the fourth bank group selection signal BGSEL3, the MPR mode signal MPR_MD, and the data width option mode signal X16_MD, a third inverter INV01 for inverting the output signal of the second NAND gate NAND01, a second NOR gate NOR01 for performing a NOR operation on the output signal of the third inverter INV01 and the second bank group selection signal BGSEL1, and a fourth inverter INV11 for inverting the output signal SELB1 of the second NOR gate NOR01. Here, the output signal SELB1 of the second NOR gate NOR01 and the output signal SEL1 of the fourth inverter INV11 are used as the second route selection signals SEL1 and SELB1.

The third route selection signal generator 215 includes a fifth inverter INV02 for inverting the third bank group selection signal BGSEL2 and a sixth inverter INV12 for inverting the output signal SELB2 of the fifth inverter INV02. Here, the output signal SELB2 of the fifth inverter INV02 and the output signal SEL2 of the sixth inverter INV12 are used as the third route selection signals SEL2 and SELB2. Furthermore, the fourth route selection signal generator 217 includes a seventh inverter INV03 for inverting the fourth bank group selection signal BGSEL3 and an eighth inverter INV13 for inverting the output signal SELB3 of the seventh inverter INV03. Here, the output signal SELB3 of the seventh inverter INV03 and the output signal SEL3 of the eighth inverter INV13 are used as the fourth route selection signals SEL3 and SELB3.

Referring back to FIG. 3, the route providing and data output unit 220 includes a lower route connection unit 221 for coupling at least one of the first to the fourth global lines GIO_BG0<0:63> to GIO_BG3<0:63> to respective lower coupling nodes in response to the first to the fourth route selection signals SEL0 to SEL3 and SELB0 to SELB3, a lower pipe latch unit 223 for temporarily storing normal data or multi-purpose data DSEL_LDQ<0:63> transferred through the lower coupling nodes, and a lower output unit 225 for serializing the normal data or latched multi-purpose data DPIP_LDQ<0:63> in the lower pipe latch unit 223 and externally outputting the normal data or the multi-purpose data DPIP_LDQ<0:63> through a plurality of lower pads LDQ0 to LDQ7 (not shown).

Referring to FIG. 5, the lower route connection unit 221 is described in more detail, and only elements corresponding to the first to the fourth global lines GIO_BG0<0> to GIO_BG3<0> are described, for convenience of description. Referring to FIG. 5, the lower route connection unit 221 includes a first lower transfer gate 221A for selectively coupling the first global line GIO_BG0<0> and a first lower coupling node CN_LDQ0 in response to the first route selection signal SEL0 and SELB0, a second lower transfer gate 221B for selectively coupling the second global line GIO_BG1<0> and the first lower coupling node CN_LDQ0 in response to the second route selection signals SEL1 and SELB1, a third lower transfer gate 221C for selectively coupling the third global line GIO_BG2<0> and the first lower coupling node CN_LDQ0 in response to the third route selection signals SEL2 and SELB2, a fourth lower transfer gate 221D for selectively coupling the fourth global line GIO_BG3<0> and the first lower coupling node CN_LDQ0 in response to the fourth route selection signals SEL3 and SELB3, and a first lower latch unit 221E for latching normal data or multi-purpose data transferred through the first lower coupling node CN_LDQ0. The first lower latch unit 221E is provided in order to prevent the first lower coupling node CN_LDQ0 from being floated. The lower route connection unit 221 configured as described above functions as a medium between the plurality of first to fourth global lines GIO_BG0<0:63> to GIO_BG3<0:63> electrically isolated from each other and also functions as a data output route for the plurality of third and fourth global lines GIO_BG2<0:63> and GIO_BG3<0:63>. Meanwhile, the lower pipe latch unit 223 and the lower output unit 225 are already known in the art, and thus a detailed description thereof is omitted.

Figure 6:
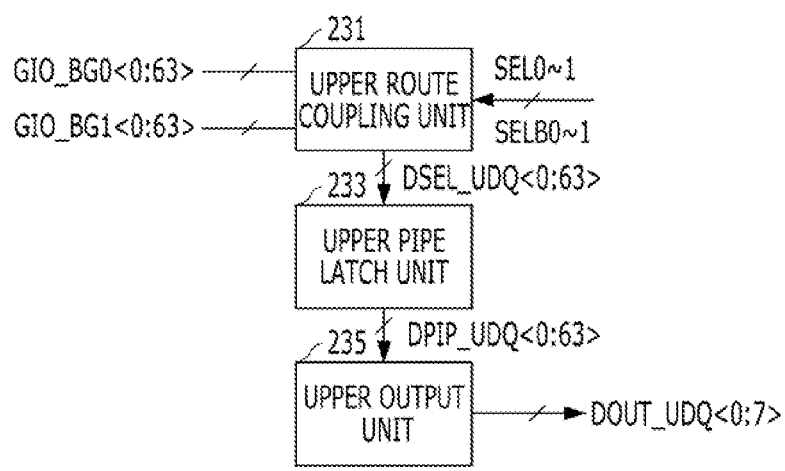
FIG. 6 shows a detailed block diagram of an upper data output unit shown in FIG. 2.
Figure 7:
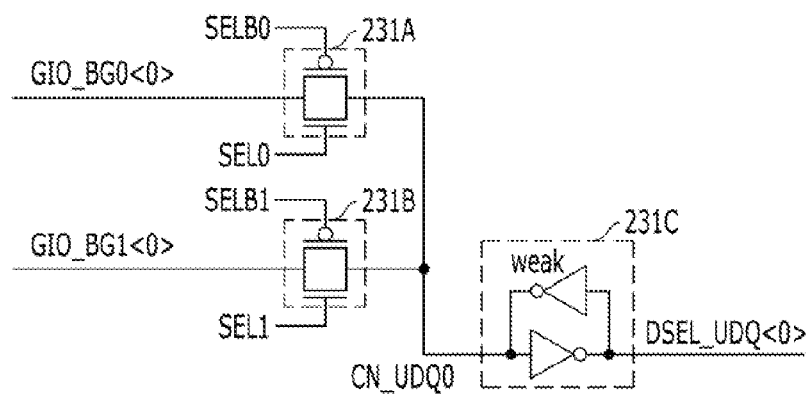
FIG. 7 shows a circuit diagram of an upper route connection unit shown in FIG. 6.

Furthermore, FIG. 6 shows a detailed block diagram of the upper data output unit UDQ in FIG. 2, and FIG. 7 illustrates a circuit diagram of an upper route connection unit shown in FIG. 6.

Referring to FIG. 6, the upper data output unit UDQ includes an upper route connection unit 231 for coupling any one of the first and the second global lines GIO_BG0<0:63> and GIO_BG1<0:63> to respective upper coupling nodes in response to the first and the second route selection signals SEL0, SEL1, SELB0 and SELB1, an upper pipe latch unit 233 for temporarily storing normal data or the multi-purpose data DSEL_UDQ<0:63> transferred through the upper coupling nodes, and an upper output unit 235 for serializing the normal data or latched multi-purpose data DPIP_UDQ<0:63> in the upper pipe latch unit 233 and externally outputting the normal data or the multi-purpose data DPIP_UDQ<0:63> through the plurality of upper pads (not shown).

The upper route connection unit 231 is described in more detail with reference to FIG. 7, and only elements corresponding to the first and the second global lines GIO_BG0<0> and GIO_BG1<0> are described, for convenience of description. Referring to FIG. 7, the upper route connection unit 231 includes a first upper transfer gate 231A for selectively coupling the first global line GIO_BG0<0> and a first upper coupling node CN_UDQ0 in response to the first route selection signals SEL0 and SELB0, a second upper transfer gate 231B for selectively coupling the second global line GIO_BG1<0> and the first upper coupling node CN_UDQ0 in response to the second route selection signals SEL1 and SELB1, and a first upper latch unit 231C for latching normal data or multi-purpose data transferred through the first upper coupling node CN_UDQ0. The first upper latch unit 231C is provided in order to prevent the first upper coupling node CN_UDQ0 from being floated. Meanwhile, the upper pipe latch unit 233 and the upper output unit 235 are known in the art, and thus a detailed description thereof is omitted.

A method of driving the semiconductor device 200 as described above in accordance with the first exemplary embodiment of the present invention is described below.

In the following exemplary embodiment of the present invention, it is assumed that a maximum data width option mode is an 'X16 mode'. For reference, the X16 mode includes an operation of inputting or outputting data through 16 data pads that include eight upper pads and eight lower pads.

First, a method of driving the semiconductor device 200 in a normal mode is described below.

When the X16 mode is entered, the upper data output unit UDQ externally outputs normal data, supplied by any one of the first and the second upper bank groups BG0 and BG1, through the eight upper pads (not shown), and the data transfer and output unit NEW_LDQ externally outputs normal data, supplied by any one of the first and the second lower bank groups BG2 and BG3, through the eight lower pads (not shown). Here, the upper data output unit UDQ couples any one of the first and second global lines, e.g., GIO_BG0<0> and GIO_BG1<0>, to upper coupling nodes, e.g., CN_LDQ0, in response to the first and the second route selection signals SEL0, SEL1, SELB0 and SELB1 and externally outputs normal data, loaded onto the first global lines GIO_BG0<0:63> or the second global lines GIO_BG1<0:63> through the eight upper pads. Furthermore, the data transfer and output unit NEW_LDQ couples any one of the third and fourth global lines, e.g., GIO_BG2<0> and GIO_BG3<0>, to lower coupling nodes, e.g., CN_LDQ0, in response to the first to the fourth route selection signals SEL0 to SEL3 and SELB0 to SELB3 and externally outputs normal data, loaded onto the third global lines GIO_BG2<0:63> or the fourth global lines GIO_BG3<0:63> through the eight lower pads.

Meanwhile, when an X8 mode is entered, only the data transfer and output unit NEW_LDQ is enabled, thus externally outputting normal data, supplied by at least one of the first and the second upper bank groups BG0 and BG1 and the first and the second lower bank groups BG2 and BG3, through the eight lower pads. Here, the data transfer and output unit NEW_LDQ couples any one of the first to fourth global lines, e.g., GIO_BG0<0> to GIO_BG3<0>, to the lower coupling nodes, e.g., CN_LDQ0, in response to the first to the fourth route selection signals SEL0 to SEL3 and SELB0 to SELB3 and externally outputs normal data, loaded onto the first global lines GIO_BG0<0:63>, the second global lines GIO_BG1<0:63>, the third global lines GIO_BG2<0:63> or the fourth global lines GIO_BG3<0:63>, through the eight lower pads.

A method of driving the semiconductor device 200 in an MPR operation mode is described below.

When the X16 mode is entered, the data transfer and output unit NEW_LDQ transfers multi-purpose data supplied by the multi-purpose register MPR to the upper data output unit UDQ, and externally outputs the multi-purpose data through the eight lower pads. Here, the data transfer and output unit NEW_LDQ couples first and third global lines, e.g., GIO_BG0<0> and GIO_BG2<0>, to the lower coupling nodes, e.g., CN_LDQ0, or couples second and fourth global lines, e.g., GIO_BG1<0> and GIO_BG3<0>, to the lower coupling node, e.g., CN_LDQ0, in response to the first to the fourth route selection signals SEL0 to SEL3 and SELB0 to SELB3 and transfers multi-purpose data loaded onto the third global lines GIO_BG2<0:63> or the fourth global lines GIO_BG3<0:63>, to the first global lines GIO_BG0<0:63> or the second global lines GIO_BG1<0:63>. Accordingly, the upper data output unit UDQ externally outputs the multi-purpose data loaded onto the first global lines GIO_BG0<0:63> or the second global lines GIO_BG1<0:63>, through the eight upper pads, and the data transfer and output unit NEW_LDQ externally outputs the multi-purpose data loaded onto the third global lines GIO_BG2<0:63> or the fourth global lines GIO_BG3<0:63>, through the eight lower pads.

In summary, the method of driving the semiconductor device 200 includes sending normal data by bank group through the plurality of first to fourth global lines GIO_BG0<0:63> to GIO_BG3<0:63> in a normal mode, entering an X16 mode and an MPR operation mode, electrically coupling the first and third global lines GIO_BG0<0:63> and GIO_BG2<0:63> or electrically coupling the second and fourth global lines GIO_BG1<0:63> and GIO_BG3<0:63>, providing the third global lines GIO_BG2<0:63> or the fourth global lines GIO_BG3<0:63> with multi-purpose data stored in the multi-purpose register MPR, and externally outputting, by the upper data output unit UDQ, the mufti-purpose data loaded onto the first global lines GIO_BG0<0:63> or the second global lines GIO_BG1<0:63> and simultaneously externally outputting, by the data transfer and output unit NEW_LDQ, the multi-purpose data loaded onto the third global lines GIO_BG2<0:63> or the fourth global lines GIO_BG3<0:63>.

In particular, when providing the multi-purpose data to the third global lines GIO_BG2<0:63> or the fourth global lines GIO_BG3<0:63>, the first and the third global lines GIO_BG0<0:63> and GIO_BG2<0:63> may be electrically coupled or the plurality of second and fourth global lines GIO_BG1<0:63> and GIO_BG3<0:63> may be electrically coupled by controlling a route along which the normal data is transferred, that is, a data route included in the data transfer and output unit NEW_LDQ.

In accordance with the aforementioned exemplary embodiment of the present invention, in the MPR operation mode, multi-purpose data may be transferred between the global lines by only controlling a data route used in the normal mode. Accordingly, there is an advantage in that multi-purpose data corresponding to a maximum data width option mode, e.g., X16 mode, supported by a semiconductor device can be outputted through one MPR.

A semiconductor device in accordance with an exemplary second exemplary embodiment of the present invention is described below. The semiconductor device in accordance with the second embodiment of the present invention has the same construction as the semiconductor device 200 in accordance with the first embodiment of the present invention (refer to FIG. 2) except the internal construction of the data transfer and output unit NEW_LDQ. Accordingly, in the second embodiment of the present invention, only the data transfer and output unit. NEW_LDQ is described. Furthermore, regarding elements corresponding to those of the first embodiment, a prime sign "'" is assigned to the reference numerals used in the first embodiment, e.g., first global lines GIO_BG0<0:63>'.

Figure 8:
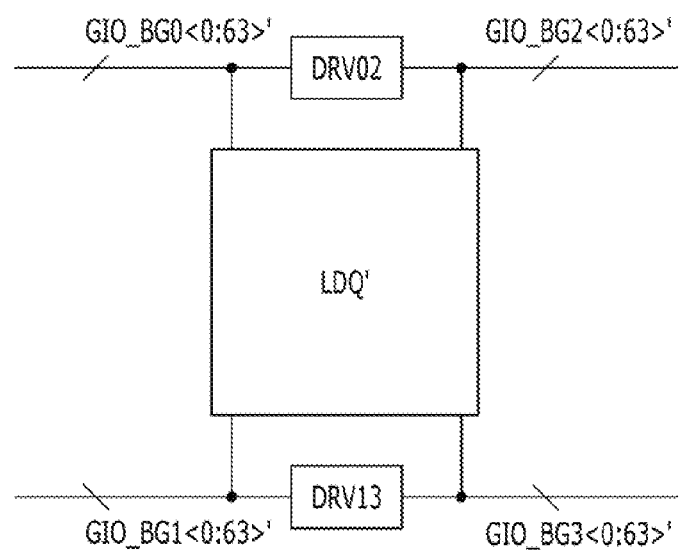
FIG. 8 shows a detailed block diagram illustrating another example of a lower data output unit shown in FIG. 2.
Figure 9:
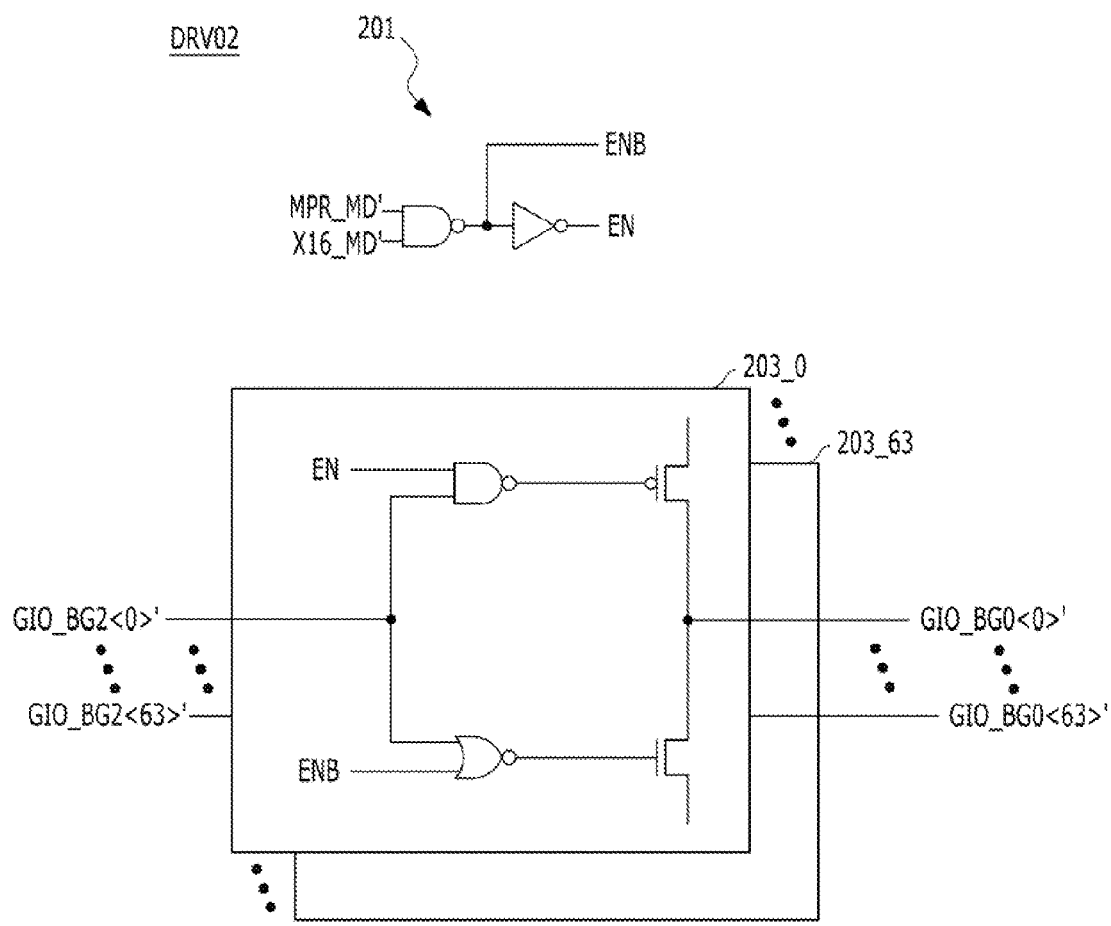
FIG. 9 shows a circuit diagram of a transfer unit shown in FIG. 8.

FIG. 8 is a block diagram of a data transfer and output unit NEW_LDQ' included in the semiconductor device in accordance with the second embodiment of the present invention, and FIG. 9 shows a circuit diagram of a first transfer unit DRV02 shown in FIG. 8.

Referring to FIG. 8, the data transfer and output unit NEW_LDQ' includes a lower data output unit LDQ' for externally outputting normal data, loaded onto a plurality of first global lines GIO_BG0<0:63>', a plurality of second glob& lines GIO_BG1<0:63>', a plurality of third global lines GIO_BG2<0:63>', or a plurality of fourth global lines GIO_BG3<0:63>', through the eight lower pads in a normal mode and externally outputting multi-purpose data, loaded onto the third global lines GIO_BG2<0:63>' or the fourth global lines GIO_BG3<0:63>', through the eight lower pads in an MPR operation mode, a first transfer unit DRV02 for transferring the multi-purpose data loaded onto the third global lines GIO_BG2<0:63>' to the first global lines GIO_BG0<0:63>' in the MPR operation mode, and a second transfer unit DRV13 for transferring the multi-purpose data loaded onto the fourth global lines GIO_BG3<0:63>' to the second global lines GIO_BG1<0:63>' in the MPR operation mode.

Here, the lower data output unit LDQ' has the same construction as a known lower data output unit LDQ, and thus a detailed description thereof is omitted.

Furthermore, the first and the second transfer units DRV02 and DRV13 have the same construction, and thus only the first transfer unit DRV02 is described below with reference to FIG. 9.

Referring to FIG. 9, the first transfer unit DRV02 includes an enable signal generation unit 201 for generating positive and negative enable signals EN and ENB in response to an MPR mode signal MPR_MD' and a predetermined data width option mode signal X16_MD' and a plurality of drivers 203_0 to 203_63 for driving the first global lines GIO_BG0<0:63>' in response to multi-purpose data that has been loaded onto the third global lines GIO_BG2<0:63>' in response to the positive and negative enable signals EN and ENB.

The enable signal generation unit 201 includes a NAND gate for performing a NAND operation on the MPR mode signal MPR_MD' and the predetermined data width option mode signal X16_MD' and an inverter for inverting the output signal ENB of the NAND gate. Here, the output signal ENB of the NAND gate and the output signal EN of the inverter are used as the enable signals EN and ENB.

Furthermore, each of the plurality of drivers 203_0 to 203_63 includes a NAND gate for performing a NAND operation on multi-purpose data loaded onto the third global lines GIO_BG2<0:63>' and the positive enable signal EN, a PMOS transistor for driving the first global lines GIO_BG0<0:63>' with a source voltage in response to the output signal of the NAND gate, a NOR gate for performing a NOR operation on multi-purpose data loaded onto the third global lines GIO_BG2<0:63>' and the negative enable signal ENB, and an NMOR transistor for driving the first global lines GIO_BG0<0:63>' with a sink voltage in response to the output signal of the NOR gate. Here, the driving power of the plurality of drivers 203_0 to 203_63 may be designed to be controlled by taking a resistance component of the global lines, etc. into consideration.

The operations of the semiconductor device described above in accordance with the second exemplary embodiment of the present invention are described below.

In the following embodiment of the present invention, it is assumed that a maximum data width option mode is an 'X16 mode'. For reference, the X16 mode includes an operation for inputting or outputting data through 16 data pads that include eight upper pads and eight lower pads.

First, the operation of the semiconductor device in a normal mode is described below.

When the X16 mode is entered, an upper data output unit UDQ' externally outputs normal data supplied by any one of the first and the second upper bank groups BG0' and BG1', through the eight upper pads, and the lower data output unit LDQ' externally outputs normal data supplied by any one of the first and the second lower bank groups BG2' and BG3', through the eight lower pads.

Meanwhile, when an X8 mode is entered, only the lower data output unit LDQ' is enabled, thus externally outputting normal data, supplied by any one of the first and the second upper bank groups BG0' and BG1' and the first and the second lower bank groups BG2' and BG3', through the eight lower pads.

Since the MPR mode signal MPR_MD' remains deactivated in the normal mode, the first and the second transfer units DRV02 and DRV13 remain disabled irrespective of the maximum data width option mode signal X16_MD.

The operation of the semiconductor device in an MPR operation mode is described below.

When the X16 mode is entered, the first and the second transfer units DRV02 and DRV13 are enabled in response to the MPR mode signal MPR_MD' and the predetermined data width option mode signal X16_MD' that are activated at the same time.

In this state, when the multi-purpose register MPR provides multi-purpose data to the third global lines GIO_BG2<0:63>' or the fourth global lines GIO_BG3<0:63>', the first transfer unit DRV02 or the second transfer unit DRV13 transfers the multi-purpose data, loaded onto the third global lines GIO_BG2<0:63>' or the fourth global lines GIO_BG3<0:63>', to the first global lines GIO_BG0<0:63>' or the second global lines GIO_BG1<0:63>'.

In response thereto, the upper data output unit UDQ' externally outputs the mufti-purpose data loaded onto the first global lines GIO_BG0<0:63>' or the second global lines GIO_BG1<0:63>' through the eight upper pads, and the lower data output unit LDQ' externally outputs the multi-purpose data loaded onto the third global lines GIO_BG2<0:63>' or the fourth global lines GIO_BG3<0:63>' through the eight lower pads.

In accordance with the second embodiment of the present invention, the driver for transferring multi-purpose data is provided between the global lines isolated from each other. Accordingly, there is an advantage in that multi-purpose data may be rapidly transferred without directly affecting the data route of the lower data output unit LDQ'.

Furthermore, there is an advantage in that an area occupied by the multi-purpose register MPR may be minimized because multi-purpose data corresponding to a maximum data width option mode (e.g., X16 mode) supported by a semiconductor device may be outputted through one MPR.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising first and second bank groups coupled to first and second data lines which are electrically isolated from each other, the semiconductor device comprising:
 a register unit suitable for providing predetermined data to the second data line in a specific mode;
 a data transfer and output unit suitable for externally outputting the predetermined data loaded onto the second data line and simultaneously transferring the predetermined data to the first data line in the specific mode; and
 a data output unit suitable for externally outputting the predetermined data loaded onto the first data line in the specific mode,
 wherein the specific mode comprises a maximum data width option mode of data width option modes supported by the semiconductor device and a multi-purpose register (MPR) operation mode.

2. The semiconductor device of claim 1, wherein
 the register unit is disposed in a second peripheral area closer to a second memory area in which the second bank group is disposed than to a first memory area in which the first bank group is disposed, and
 the data transfer and output unit and the data output unit are disposed in a first peripheral area closer to the first memory area than to the second memory area.

3. The semiconductor device of claim 1, wherein the register unit comprises a multi-purpose register (MPR).

4. The semiconductor device of claim 1, wherein
 the data output unit externally outputs first normal data of the first bank group loaded onto the first data line in a normal mode, and
 the data transfer and output unit externally outputs second normal data of the second bank group loaded onto the second data line in the normal mode.

5. A semiconductor device comprising first and second bank groups coupled to first and second data lines which are electrically isolated from each other, the semiconductor device comprising:
 a multi-purpose register (MPR) suitable for providing multi-purpose data to the second data line in response to an MPR mode signal;
 a route selection unit suitable for generating first and second route selection signals by combining first and second bank group selection signals, the MPR mode signal, and a predetermined data width option mode signal;
 a route providing and data output unit suitable for externally outputting the multi-purpose data loaded onto the second data line and simultaneously transferring the multi-purpose data to the first data line in response to the first and the second route selection signals; and
 a data output unit suitable for externally outputting the multi-purpose data loaded onto the first data line in response to the first route selection signal.

6. The semiconductor device of claim 5, wherein:
 the multi-purpose register is disposed in a second peripheral area closer to a second memory area in which the second bank group is disposed than to a first memory area in which the first bank group is disposed, and
 the route providing and data output unit and the data output unit are disposed in a first peripheral area closer to the first memory area than to the second memory area.

7. The semiconductor device of claim 5, wherein:
the data output unit externally outputs normal data of the first bank group loaded onto the first data line in a normal mode, and
the route providing and the data output unit externally outputs normal data of the second bank group loaded onto the second data line in the normal mode.

8. The semiconductor device of claim 7, wherein the data output unit comprises:
a first route connection unit suitable for selectively coupling the first data line to a first coupling node in response to the first route selection signal;
a first pipe latch unit suitable for temporarily storing data transferred through the first coupling node; and
a first output unit suitable for externally outputting the data latched in the first pipe latch unit.

9. The semiconductor device of claim 7, wherein the route providing and the data output unit comprises:
a second route connection unit suitable for coupling at least one of the first and the second data lines to a second coupling node in response to the first and the second route selection signals;
a second pipe latch unit suitable for temporarily storing data transferred through the second coupling node; and
a second output unit suitable for externally outputting the data latched in the second pipe latch unit.

10. The semiconductor device of claim 5, wherein the predetermined data width option mode signal is a signal corresponding to a maximum data width option mode of data width option modes supported by the semiconductor device.

11. A semiconductor device comprising first and second bank groups coupled to first and second data lines which are electrically isolated from each other, the semiconductor device, the semiconductor device comprising:
a multi-purpose register (MPR) suitable for providing multi-purpose data to the first data line in response to an MPR mode signal;
an enable signal generation unit suitable for generating an enable signal in response to an MPR mode signal and a predetermined data width option mode signal;
a driver suitable for transferring the multi-purpose data loaded onto the first data line to the second data line in response to the enable signal;
a first data output unit suitable for externally outputting the multi-purpose data loaded onto the first data line; and
a second data output unit suitable for externally outputting the multi-purpose data loaded onto the second data line.

12. The semiconductor device of claim 11, wherein
the multi-purpose register is disposed in a first peripheral area closer to a first memory area in which the first bank group is disposed than to a second memory area in which the second bank group is disposed, and
the first and the second data output unit is disposed in a second peripheral area closer to the second memory area than to the first memory area.

13. The semiconductor device of claim 11, wherein
the first data output unit externally outputs normal data of the first bank group loaded onto the first data line in a normal mode, and
the second data output unit externally outputs normal data of the second bank group loaded onto the second data line in the normal mode.

14. The semiconductor device of claim 11, wherein the predetermined data width option mode signal is a signal corresponding to a maximum data width option mode of data width option modes supported by the semiconductor device.

* * * * *